(12) United States Patent
Braunisch et al.

(10) Patent No.: US 10,833,020 B2
(45) Date of Patent: Nov. 10, 2020

(54) HIGH DENSITY INTERCONNECT STRUCTURES CONFIGURED FOR MANUFACTURING AND PERFORMANCE

(71) Applicant: Intel Corporation, Santa Clara, CA (US)

(72) Inventors: Henning Braunisch, Phoenix, AZ (US); Kemal Aygun, Tempe, AZ (US); Ajay Jain, Albuquerque, NM (US); Zhiguo Qian, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/305,752

(22) PCT Filed: Jun. 30, 2016

(86) PCT No.: PCT/US2016/040486
§ 371 (c)(1),
(2) Date: Nov. 29, 2018

(87) PCT Pub. No.: WO2018/004619
PCT Pub. Date: Jan. 4, 2018

(65) Prior Publication Data
US 2019/0252322 A1    Aug. 15, 2019

(51) Int. Cl.
*H01L 21/48*        (2006.01)
*H01L 23/538*       (2006.01)
(Continued)

(52) U.S. Cl.
CPC ........ *H01L 23/5386* (2013.01); *H01L 21/486* (2013.01); *H01L 21/4857* (2013.01);
(Continued)

(58) Field of Classification Search
CPC ............ H01L 23/5386; H01L 21/4857; H01L 21/486; H01L 23/49822; H01L 23/5383; H01L 24/00
(Continued)

(56) References Cited

U.S. PATENT DOCUMENTS 6,596,624 B1    7/2003    Romankiw
8,064,224 B2    11/2011   Mahajan et al.
(Continued)

FOREIGN PATENT DOCUMENTS

WO    WO-2018004619 A1    1/2018

OTHER PUBLICATIONS

"International Application Serial No. PCT/US2016/040486, International Search Report dated Mar. 30, 2017", 3 pgs.
(Continued)

*Primary Examiner* — Tremesha S Willis
(74) *Attorney, Agent, or Firm* — Schwegman Lundberg & Woessner, P.A.

(57) ABSTRACT

Discussed generally herein are methods and devices including or providing a high density interconnect structure. A high density interconnect structure can include a stack of alternating dielectric layers and metallization layers comprising at least three metallization layers including conductive material with low k dielectric material between the conductive material, and at least two dielectric layers including first medium k dielectric material with one or more first vias extending therethrough, the at least two dielectric layers situated between two metallization layers of the at least three metallization layers, a second medium k dielectric material directly on a top surface of the stack, a second via extending through the second medium k dielectric material, the second via electrically connected to conductive material in a metallization layer of the three or more metallization layers, and
(Continued)

a pad over the second medium k dielectric material and electrically connected to the second via.

15 Claims, 6 Drawing Sheets

(51) Int. Cl.
*H01L 23/498* (2006.01)
*H01L 23/00* (2006.01)
*H01L 23/14* (2006.01)
*H01L 23/31* (2006.01)

(52) U.S. Cl.
CPC .... *H01L 23/49822* (2013.01); *H01L 23/5383* (2013.01); *H01L 24/00* (2013.01); *H01L 24/19* (2013.01); *H01L 24/20* (2013.01); *H01L 23/147* (2013.01); *H01L 23/3128* (2013.01); *H01L 23/49816* (2013.01); *H01L 23/49827* (2013.01); *H01L 24/16* (2013.01); *H01L 2224/16227* (2013.01); *H01L 2224/215* (2013.01); *H01L 2224/73204* (2013.01); *H01L 2924/05442* (2013.01)

(58) Field of Classification Search
USPC ......................................................... 174/264
See application file for complete search history.

(56) References Cited

U.S. PATENT DOCUMENTS

| | | |
|---|---|---|
| 8,643,184 B1 | 2/2014 | Zhang et al. |
| 2004/0135223 A1 | 7/2004 | Allman et al. |
| 2004/0150069 A1 | 8/2004 | Low et al. |
| 2005/0116345 A1 | 6/2005 | Murtuza |
| 2013/0292817 A1 | 11/2013 | Lacroix et al. |
| 2015/0206799 A1 | 7/2015 | Yu et al. |
| 2020/0168553 A1 | 5/2020 | Braunisch et al. |

OTHER PUBLICATIONS

"International Application Serial No. PCT/US2016/040486, Written Opinion dated Mar. 30, 2017", 6 pgs.

Braunisch, Henning, et al., "High-speed performance of Silicon Bridge die-to-die interconnects", Electrical Performance of Electronic Packaging and Systems (EPEPS), IEEE 20th Conference, (Oct. 23, 2011), 95-98.

Mahajan, Ravi, et al., "Embedded Multi-Die Interconnect Bridge (EMIB)—A High Density, High Bandwidth Packaging Interconnect", IEEE 66th Electronic Components and Technology Conference, (2016), 9 pgs.

"European Application Serial No. 16907572.8, Extended European Search Report dated Jan. 30, 2020", 10 pgs.

"U.S. Appl. No. 16/774,508, Non Final Office Action dated Apr. 17, 2020", 9 pgs.

HIGH DENSITY INTERCONNECT STRUCTURES CONFIGURED FOR MANUFACTURING AND PERFORMANCE

CROSS-REFERENCE TO RELATED APPLICATION

This application is a U.S. National Stage Filing under 35 U.S.C. 371 from International Application No. PCT/US2016/040486, filed on Jun. 30, 2016, which application is incorporated herein by reference in its entirety.

TECHNICAL FIELD

This disclosure relates generally to high density interconnect structure technology. One or more embodiments regard a manufacturing process to provide high density interconnect structures with improved performance characteristics and/or improved yield loss in manufacturing.

BACKGROUND ART

Providing access to input/output (I/O) and/or power of a semiconductor chip can include using a through silicon via (TSV). A TSV is a hole through a die that is filled with conductive material. The TSV provides an electrical interconnect through a silicon die or a wafer. The TSV is generally used as an alternative to wire bonded or printed electrical interconnects. Some advantages of TSV include a reduced interconnect length and better performance over the alternative technologies. Disadvantages of TSV technology include via fabrication inducing tensile stress in the silicon, vias may experience compressive "hoop" stresses which could lead to via buckling, quantity and spacing of vias may result in undesirable stress fields and more complicated routing, and induced stresses may lead to die cracking.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Figure 1:
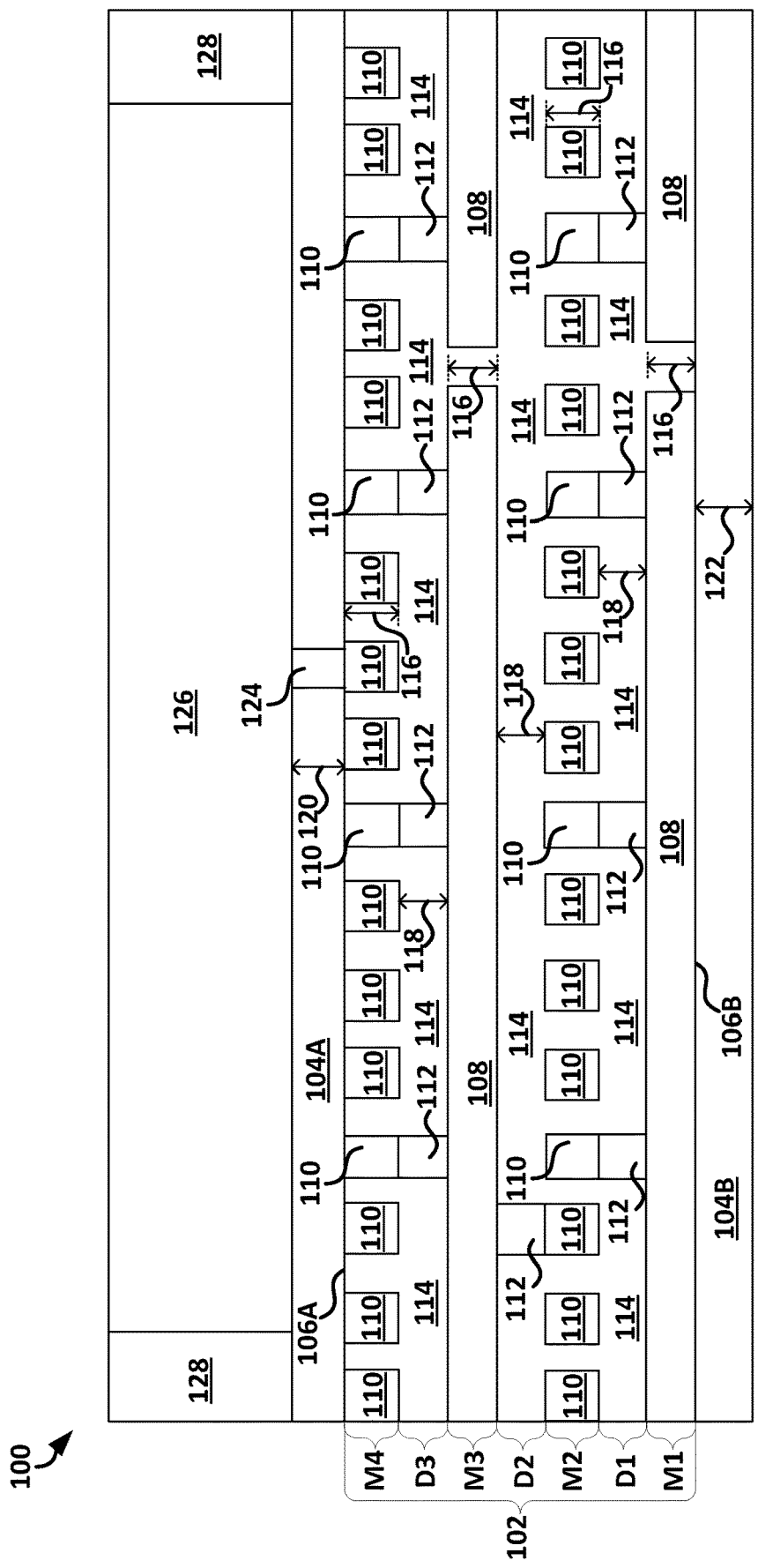
FIG. 1 illustrates, by way of example, a cross-section diagram of an embodiment of a high density interconnect structure.

The following description and the drawings sufficiently illustrate embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

The following description includes terms, such as upper, lower, first, second, etc. that are used for descriptive purposes only and are not to be construed as limiting. The examples of an apparatus, device, or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer and wafers may be made of semiconducting, non-semiconducting, or combinations of semiconducting and non-semiconducting materials.

Current electrical and/or electronic circuit packages can be created by incorporating a number of heterogeneous functions, such as Central Processing Unit (CPU) logic, graphics functions, cache memory, and other functions to create integrated System on Chip (SoC) packages. Such SoC packages can lower the complexity of a product design and can reduce the number of parts required by the product, such as by including multiple components in a single package. Picking individual packages that implement these functions and designing a circuit board around the packages chosen can be complex. Using individual packages can increase the system board area, power loss, complexity, component count, or costs over an integrated SoC package solution.

The input/output (I/O) density in a package substrate can be a function of a substrate's minimum pad size, minimum trace dimensions, minimum space dimensions, and/or the capability of the manufacturing process. The routing density in a multichip substrate can be several orders of magnitude lower (e.g., about one hundred times lower) than chip level routing density. This routing density can impact cost, size, and performance of a product.

A way to reduce the size of a product can include using a silicon interposer in a package to provide a high density chip-to-chip interconnect. Such a solution includes a higher cost, such as can be due to the cost of the silicon interposer, additional assembly and process steps in manufacturing, and/or compounding yield loss realized using the silicon interposer.

A substrate can include a high density interconnect structure in a bumpless buildup layer (BBUL) substrate or other substrate. Such a solution can allow a high density interconnect structure to be situated where it can be advantageous to include higher density interconnect routing and allow lower density interconnect routing (e.g., routing with a substrate routing technique) where such lower density routing may be advantageous (e.g., for routing power or ground lines).

Substrate routing can take up a significant amount of space and can be a factor in the overall size of a die package. By including routing created using typical substrate routing techniques, which generally results in less dense routing than chip routing techniques, there may not be enough space to route signals from the die without routing through the die. Integrating a high density interconnect structure in a package or substrate, such as a BBUL package or substrate, can allow for an increase in overall routing and interconnect density of a package, thus helping to reduce size and cost.

One previous solution included embedding a high density, silicon interconnect package in a substrate. Assembly of such a package can be challenging due to tight tolerance requirements in x, y, and z directions. The tight tolerance requirements are due, at least in part, to alignment and fitting issues in connecting the high density interconnect package to the substrate. Using a chip interconnect device (e.g., a silicon interconnect device) can include embedding the interconnect device during the substrate fabrication process.

Reference will now be made to the drawings wherein like structures will be provided with like suffix reference designations. In order to show the structures of various examples clearly, the drawings included herein are diagrammatic representations of integrated circuit structures. Thus, the actual appearance of the fabricated structures, for example in a photomicrograph, may appear different while still incorporating subject matter of the illustrated examples. Moreover, the drawings show the structures to aid in understanding the illustrated examples.

FIG. 1 illustrates, by way of example, a cross-section diagram of an embodiment of a high density interconnect structure (HDIS) 100. The HDIS 100, in one or more embodiments, can include an interconnect density of greater than 200 input/output (I/O) per millimeter (mm) per routing layer density.

The HDIS 100 as illustrated includes a dual damascene stack 102 with high k dielectric material 104A and 104B on a respective top surface 106A and bottom surface 106B thereof. The dual damascene stack 102 includes alternating metallization layers M1, M2, M3, and M4 and dielectric layers D1, D2, and D3. The M1 and M3 layers, as illustrated, are planes or meshes (e.g., ground planes or ground meshes) and the M2 and M4 layers are signal routing layers.

The high k dielectric material 104A-B can include a dielectric with a relative dielectric constant ($\varepsilon_r$) of greater than (or equal to) six. The high k dielectric material 104A-B, in one or more embodiments, can include one or more of compounds of silicon or other suitable high k chemical elements. The high k dielectric material 104A-B can help provide a hermetic seal for the dual damascene stack 102.

The metallization layers M1 and M3 as illustrated include planes or meshes conductive material 108. The metallization layers M2 and M4 as illustrated include conductive material 110 to provide signal routing. The metallization layers M1-M4 are different from the dielectric layers D1-D3 in that the metallization layers M1-M4 include conductive material formed to be more than just vias. The dielectric layers D1-D3 are composed primarily of dielectric material and can include one or more vias 112 extending therethrough. Each of the dielectric layers D1-D3 includes a medium k dielectric material 114. In one or more embodiments, the medium k dielectric material 114 includes silicon dioxide ($SiO_2$), or other medium k dielectric material 114. A medium k dielectric material includes a dielectric with a relative dielectric constant ($\varepsilon_r$) of greater than (or equal to) three and less than (or equal to) six. The conductive material 108, 110, and vias 112 can include conductive metal, such as copper, titanium, aluminum, gold, silver, or a combination thereof, among others.

A thickness 116 of the metallization layers M1-M4 can be about two micrometers ($\mu$m). A thickness 118 of the dielectric layers D1-D3 can be about two $\mu$m. A thickness 120 of the high k dielectric material 104A can be about two micrometers, in one or more embodiments. A thickness 122 of the high k dielectric material 104B can be about two micrometers, in one or more embodiments.

A conductive pad 126 can be formed on a via 124 and the high k dielectric material 104A. The via 124 extends through the high k dielectric material 104A. The conductive pad 126 and the via 124 can provide electrical access to signal routing in the dual damascene stack 102. The pad 126 can include a medium k dielectric material 128 on sides thereof. The medium k dielectric material 128 can be the same material as the medium k dielectric material 114.

A die (not shown in FIG. 1) can be electrically and mechanically connected to the pad 126 and another die (not shown in FIG. 1) can be electrically and mechanically connected to another pad of the structure 100, such as to electrically connect the two dies through the high density signal routing of the stack 102. In such a configuration, signals can be routed to the two dies in a space efficient manner, such as can be greater than two hundred I/O per millimeter per routing layer. One or more of the dies can include a central processing unit (CPU), graphics processing unit (GPU), field programmable gate array (FPGA), a radio, a transceiver, such as a high-speed transceiver, and stacked dynamic random-access memory (DRAM), such as High-Bandwidth Memory (HBM) or wide I/O (WIO). As compared to a silicon interposer, and when implemented as a silicon bridge, the high density interconnect structure 100 provides a lower cost solution that does not degrade off-package interconnects. Avoiding the degradation of off-package interconnects can be accomplished by avoiding through-silicon vias (TSVs) of the silicon interposer.

The high k dielectric material 104A-B has a relatively high dielectric constant. A high dielectric constant impacts high-speed signaling on M4 (in the embodiment of FIG. 1) and also M1 (if it is used for signal routing). An improvement to the high-speed signaling can be realized by avoiding any high k dielectric material directly abutting any of the metallization layers. Introduction of a dielectric material with a lower dielectric constant, (i.e., a low-k dielectric material) that replaces some or all of the medium k dielectric material 114 can be beneficial for electrical performance (capacitance per unit length, inter-symbol interference, crosstalk, and/or I/O power efficiency). Another advantage can be realized by making the dielectric layers D1-D3 thicker. Thicker dielectric layers can help improve electrical performance in terms of capacitance per unit length (i.e. reduced capacitance per unit length), inter-symbol interference (i.e. reduced inter-symbol interference), and/or I/O power efficiency (i.e. reduced power consumption in the signal transfer).

A problem in manufacturing the high density interconnect structure 100 includes controlling a bowing of the wafer. In terms of mechanical stress in the material, conductive material is tensile, medium k dielectric material is compressive, and typical low k dielectric materials are tensile. An improved high density interconnect structure can help overcome one or more of the deficiencies of the structure 100 discussed.

Table 1 presents a summary of the dielectric constants of dielectric materials referred to herein.

TABLE 1

Relative Dielectric Constants of Dielectric Materials

| MATERIAL | RELATIVE DIELECTRIC CONSTANT ($\in_r$) |
| --- | --- |
| HIGH K DIELECTRIC | $\in_r > 6$ |
| MID K DIELECTRIC (SiO$_2$) | $3 > \in_r < 6$ |
| LOW K DIELECTRIC | $\in_r < 3$ |

Figure 2:
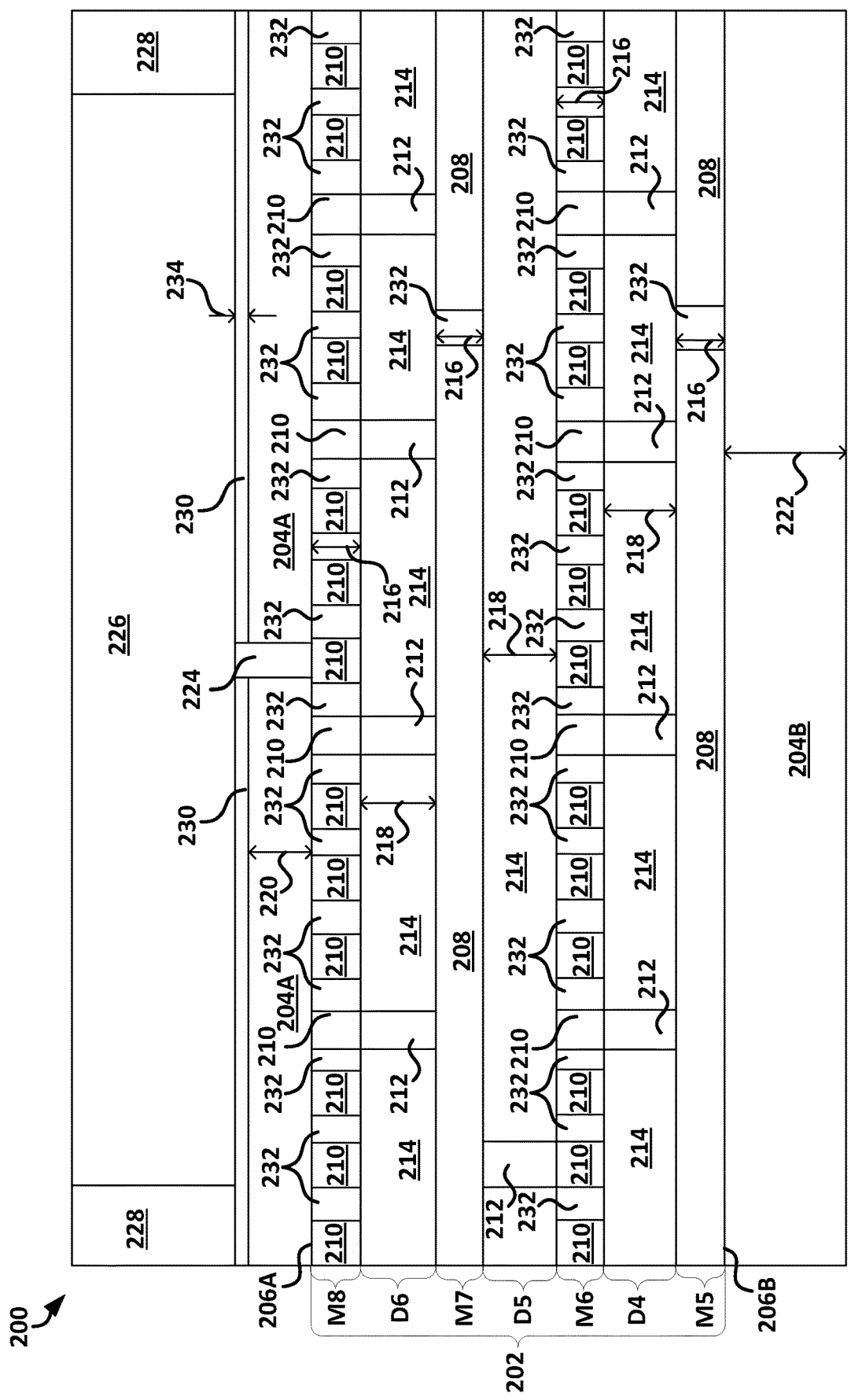
FIG. 2 illustrates, by way of example, a cross-section diagram of another embodiment of a high density interconnect structure.

FIG. 2 illustrates, by way of example, a cross-section diagram of an embodiment of another HDIS 200. The HDIS 200 can help overcome one or more of the deficiencies of the HDIS 100. The HDIS 200 as illustrated can help improve electrical performance over the HDIS 100 and can also have improved yield loss over the HDIS 100.

The HDIS 200 as illustrated includes a stack 202 of alternating metallization layers M5, M6, M7, and M8 and dielectric layers D4, D5, and D6. As illustrated, the M5 and M7 layers are planes or meshes (e.g., ground planes or ground meshes) and the M6 and M8 layers are signal routing layers.

The dielectric layers D4-D6 include a medium k dielectric material 214. A medium k dielectric material 204A is, as illustrated, on a top surface 206A of the stack 202. A medium k dielectric material 204B is, as illustrated, on a bottom surface 206B of the stack 202. A thickness 220 of the medium k dielectric material 204A can be about three μm. A thickness 222 of the medium k dielectric material 204B can be about five μm.

A high k dielectric material 230 is on top of the medium k dielectric material 204A. A thickness 234 of the high k dielectric material 230 can be under one μm, such as can be about a half a μm or about four tenths of a μm. The high k dielectric material 230 can include the same material as the high k dielectric material 104A-B.

The metallization layers M5 and M7 as illustrated include planes or meshes of conductive material 208. The metallization layers M6 and M8 as illustrated include conductive material 210 patterned for signal routing. The metallization layers M5-M8 are different from the dielectric layers D4-D6 in that the metallization layers M5-M8 include conductive material patterned to be something other than one or more vias. The dielectric layers D4-D6 are composed primarily of dielectric material with one or more vias 212 extending therethrough, generally without other metallization therein or therethrough. Each of the dielectric layers D4-D6 includes a medium k dielectric material 214. In one or more embodiments, the medium k dielectric material 214 includes a same material as the medium k dielectric material 114. The conductive material 208, 210, and vias 212 can include material that is the same as the material of the conductive material 108, 110, and the vias 112.

In one or more embodiments, a thickness 216 of the metallization layers M5-M8 can be about two μm. A thickness 218 of the dielectric layers D4-D6 can be about three μm. A thickness 234 of the high k dielectric material 230 can be less than a micrometer, in one or more embodiments. A thickness 222 of the medium k dielectric material 204B can be about five micrometers. A thickness 220 of the medium k dielectric material 204A can be three micrometers.

A conductive pad 226 can be formed on a via 224 and the high k dielectric material 230. The via 224, as illustrated, extends through the medium k dielectric material 204A and the high k dielectric material 230. The conductive pad 226 and the via 224 provide electrical access to routing in the stack 202. The pad 226 can include medium k dielectric material 228 on sides thereof. The medium k dielectric material 228 can be the same material or a different material as other medium k dielectric materials discussed herein.

A low k dielectric 232 can be situated between conductive material 208 and/or 210 and/or vias 212 in the metallization layers M5-M8. Examples of low k dielectric materials include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, and the like.

The stack 202 includes alternating tensile materials (i.e. conductive material and/or low k dielectric material) and compressive material (i.e. medium k dielectric material). Such an alternating stack can help keep the structure 200 flatter than the structure 100, such as during fabrication. At the same time, electrical performance of the structure 200 is improved over the structure 100 in terms of one or more of capacitance per unit length, inter-symbol interference, crosstalk, and/or I/O power efficiency.

The structure 200 includes low k dielectric 232 between conductive material 210 in the routing layer(s) (i.e. M6 and M8 of the structure 200), whereas the structure 100 includes medium k dielectric material 114 between conductive material 110 in the routing layers (i.e. M2 and M4). Such a difference in materials alters a capacitance between routing lines in the routing layers. A material with a lower dielectric constant between routing lines creates a lower capacitance between the routing lines than a material with a higher dielectric constant between routing lines (assuming a same distance between routing lines). Also, the lower k dielectric material is generally more tensile than the materials with a higher dielectric constant, which helps to retain flatness of the structure 200 for manufacturing.

The structure 200 includes less high k dielectric material than the structure 100. The routing lines of the structure 200 are further from high k dielectric material than the routing lines of the structure 100. This increased distance provides for less impact on the speed of signals traveling through the routing lines.

Figure 3:
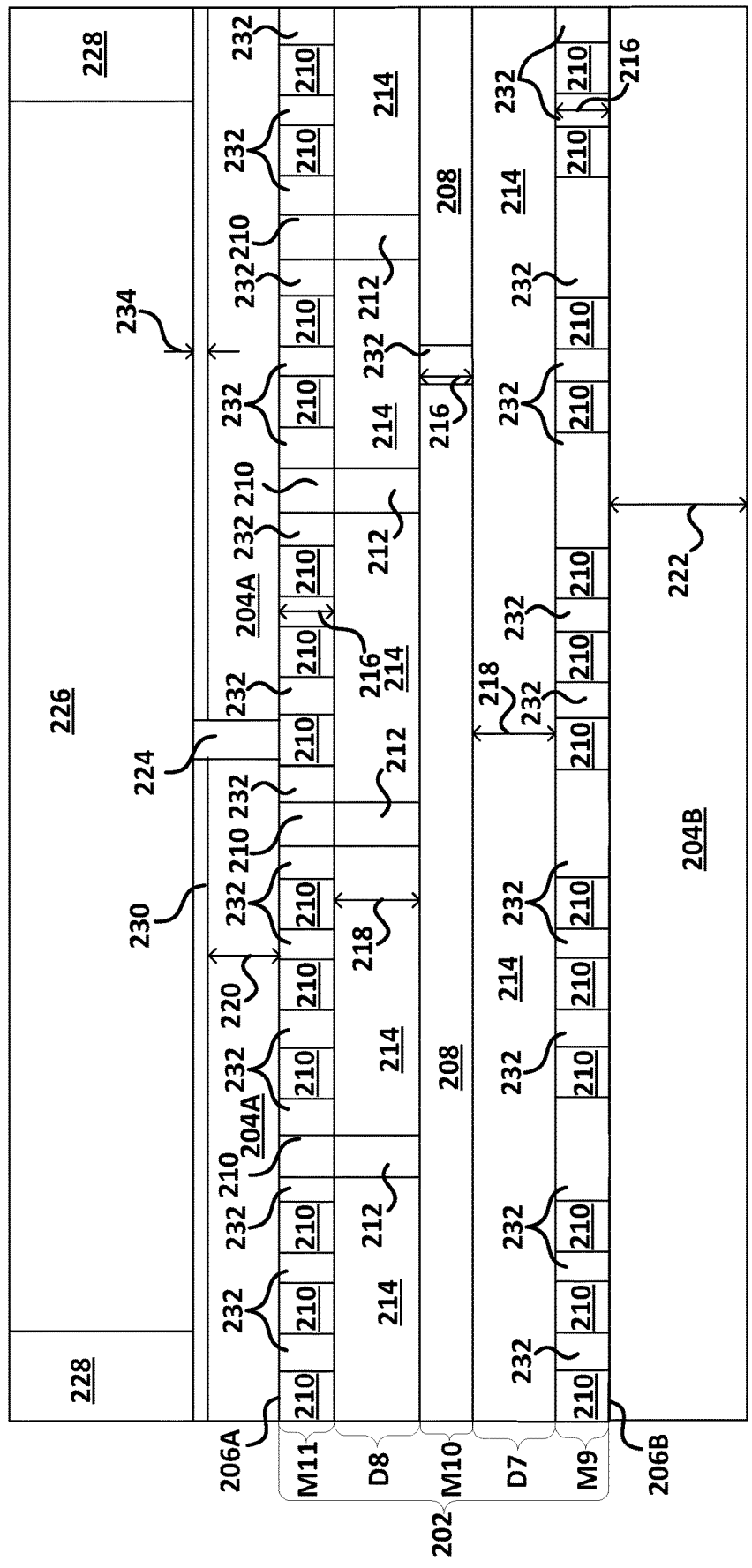
FIG. 3 illustrates, by way of example, a cross-section diagram of another embodiment of a high density interconnect structure.

The thickness 222 of the medium k dielectric material 204B can be about five μm, where such a thickness can help allow high-speed routing on M5 (as opposed to having a conductive plane or mesh on M5 as is illustrated in FIG. 2). FIG. 3 illustrates a structure 300 that includes such high speed routing on the medium k dielectric material 204B.

FIG. 3 illustrates, by way of example, a cross-section diagram of an embodiment of a high density interconnect structure 300 that includes only three metallization layers M9, M10, and M11 and only two dielectric layers D7 and D8. The structure 300 can be similar to the structure 200, with the structure 300 including fewer metallization and dielectric layers. The structure 300 can be fabricated by leaving out M5 and D4 or M6 and D5, for example, from the structure 200. The structure 300 is lower-cost as compared to the structure 200.

Using the medium k dielectric materials, low k dielectric materials, and high k dielectric materials as arranged in the structure 200 or 300 can create a structure 200 or 300 that is co-optimized for manufacturing feasibility, electrical performance, and also design flexibility (e.g., four or three metal layers supported with the same process flow as shown in FIGS. 2 and 3, respectively).

In one or more embodiments, the thickness of the conductive material 208 can be different than the thickness of the conductive material 210 of the routing layers (e.g., in the example of FIG. 2 the thickness of M5 and M7 can be different from the thickness of M6 and M8). In such embodiments, the conductive material 208 can include a thickness of between about three and about four micrometers, while the thickness of the conductive material 210 can be about two micrometers. A thicker reference layer (i.e. plane layer) can reduce resistance and inductance of the return path for routed signals (and improve power delivery as applicable). With the improved return path, the resistive and inductive coupling between signal routing lines can be reduced between routing lines in the same layer as well as across different routing layers. In general, thicker metal layers may have to use a wider trace width. However, this is not a problem with the reference layers (that are not used for signal routing) and does not affect the I/O density in the routing layers.

Figure 4:
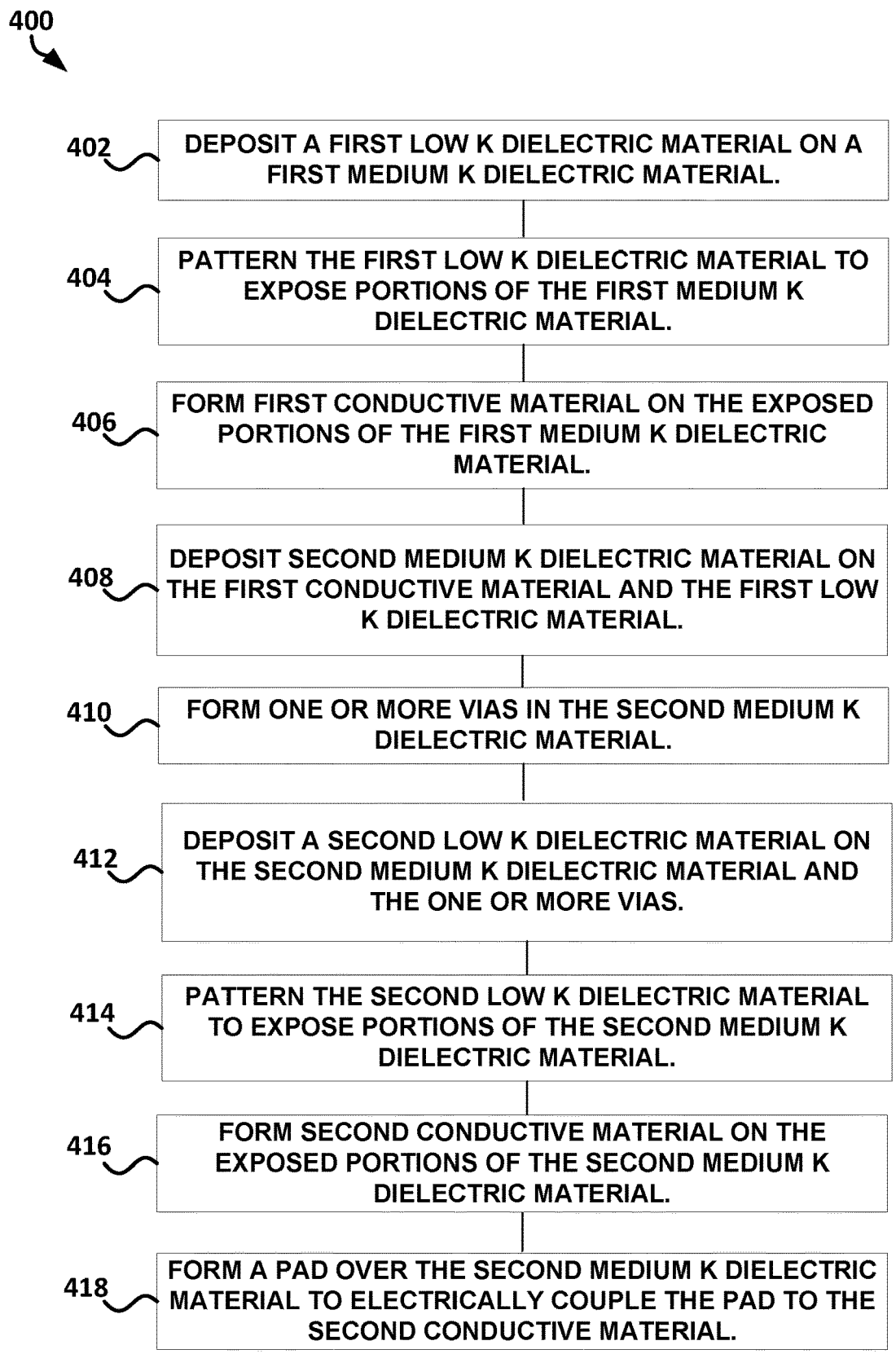
FIG. 4 illustrates, by way of example, a diagram of an embodiment of a process for manufacturing a high density interconnect structure.

FIG. 4 illustrates, by way of example, a diagram of an embodiment of a process 400 for making a high density interconnect structure, such as the structure 200 or 300. The process 400 as illustrated includes forming a stack (e.g., the stack 200 or 300) of alternating dielectric layers and metallization layers, which includes: depositing a first low k dielectric material (e.g., the low k dielectric material 232 of the metallization layer M5 or M9) on a first medium k dielectric material (e.g., the medium k dielectric material 204B), at operation 402; patterning the first low k dielectric material to expose portions of the first medium k dielectric material, at operation 404; forming first conductive material (e.g., the conductive material 208 of the metallization layer M5 or the conductive material 210 of the metallization layer M9) on the exposed portions of the first medium k dielectric material, at operation 406; depositing a second medium k dielectric material (e.g., the medium k dielectric material 214 of the dielectric layer D4 or D7) on the first conductive material and the first low k dielectric material, at operation 408; forming one or more vias (e.g., the via(s) 212 in the dielectric layers D4 or D7) in the second medium k dielectric material, at operation 410; depositing a second low k dielectric material (e.g., the low k dielectric material 232 in the metallization layer M6 or M10) on the second medium k dielectric material and the one or more vias, at operation 412; patterning the second low k dielectric material to expose portions of the second medium k dielectric material, at operation 414; and forming second conductive material (e.g., the conductive material 210 of the metallization layer M6 or the conductive material 208 of the metallization layer M10) on the exposed portions of the second medium k dielectric material, at operation 416. The process 400 as illustrated further includes forming a pad (e.g., the pad 226) over the second low k dielectric material to electrically couple the pad to the second conductive material, at operation 418.

The operation 402 can include performing a chemical vapor deposition of the first low k dielectric material. The operation 404 can include situating a mask on the first low k dielectric material and removing portions of the first low k dielectric material, such as by using a chemical, mechanical, or optical process. The operation 406 can include an additive or subtractive process for situating conductive material and/or patterning the conductive material. The operations 408 can include performing a chemical vapor deposition of the second medium k dielectric material. The operation 410 can include forming one or more holes through the second medium k dielectric material and using an additive or subtractive process to situate conductive material in the one or more holes.

The operation 412 can include performing a chemical vapor deposition of the second low k dielectric material. The operation 414 can include situating a mask on the second low k dielectric material and removing portions of the second low k dielectric material, such as by using a chemical, mechanical, or optical process. The operation 416 can include an additive or subtractive process for situating first conductive material and/or patterning the second conductive material. The operation 418 can include depositing a third medium k dielectric material over the second medium k dielectric material, removing a portion of the third medium k dielectric material, and using an additive or subtractive process to situate conductive material in the removed portions of the third medium k dielectric material.

The process 400 can further include depositing (e.g., using a chemical vapor deposition process) the first medium k dielectric material prior to depositing the first low k dielectric material. Depositing the first medium k dielectric material includes depositing the first medium k dielectric material to a thickness of about five micrometers. The operation 402 can include depositing the first low k dielectric material to a thickness of about two micrometers. The operation 402 can include depositing the first medium k dielectric material to a thickness of about three to about four micrometers. The operation 408 can include depositing the second medium k dielectric material to a thickness of about three micrometers. As such, the process 400 can incorporate elements of a damascene or dual damascene process.

The high density interconnect structures discussed herein can be co-optimized for electrical performance and manufacturing process feasibility. Among other features, alternating deposition of tensile and compressive films can help keep the wafer flat during fabrication. At the same time, electrical performance can be improved, such as in terms of capacitance per unit length, inter-symbol interference, crosstalk, and/or I/O power efficiency.

The ideas in this disclosure can be applied to the design and fabrication of high density interconnect structures (e.g., silicon bridges) as well as to the design and fabrication of silicon interposers, such as to create conventional or TSV-less silicon interposers.

Figure 5:
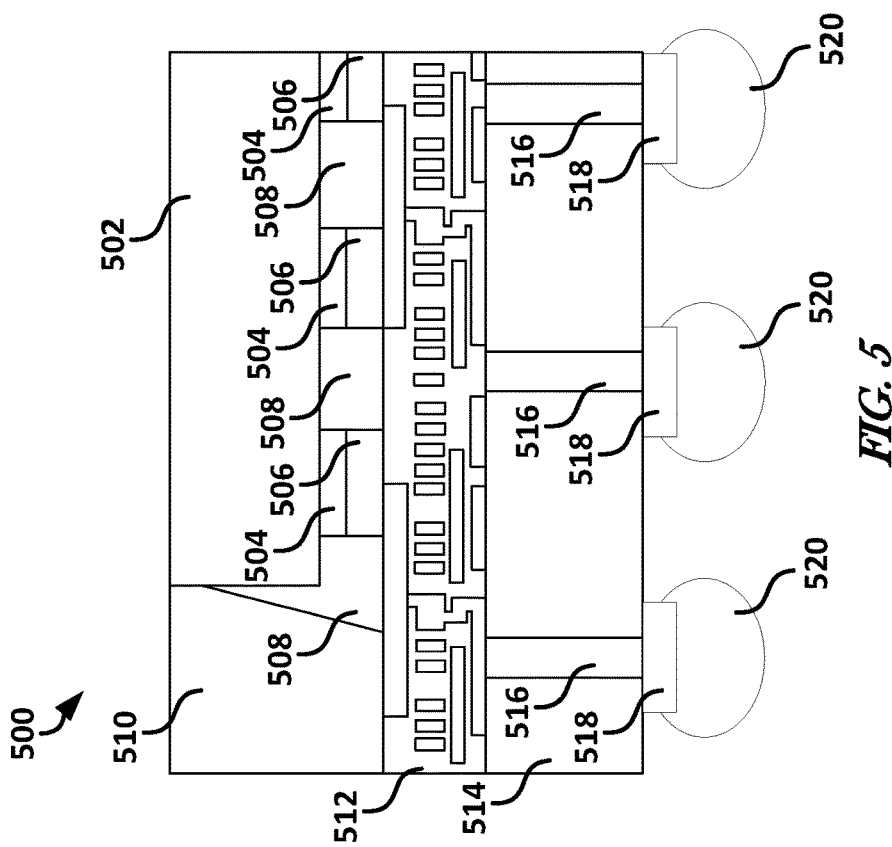
FIG. 5 illustrates, by way of example, a cross-section diagram of an embodiment of a device including a silicon interposer and a through silicon via (TSV).

FIG. 5 illustrates, by way of example, a cross-section diagram of an embodiment of a device 500 that includes a silicon interposer 512 and a TSV 516. A pad 504 of a die 502 is attached to a pad 506 on the silicon interposer 512 through a conductive adhesive (e.g., solder). An underfill material 508 is deposited under and around the pads 504 and 506. A molding material 510 is deposited around the die 502 and on exposed portions of the silicon interposer 512. The TSV 516 extends through a silicon substrate 514 and provides an electrical path from a pad on a surface of the substrate 514 to the silicon interposer 512 and to the die 502. A solder ball 520 (or other conductive adhesive) can be used to electrically and mechanically connect the device 500 to a board (e.g., a printed circuit board (PCB)), another device, or other electrical or electronic device. The silicon interposer 512 is generally fabricated using a standard dual damascene process.

Figure 6:
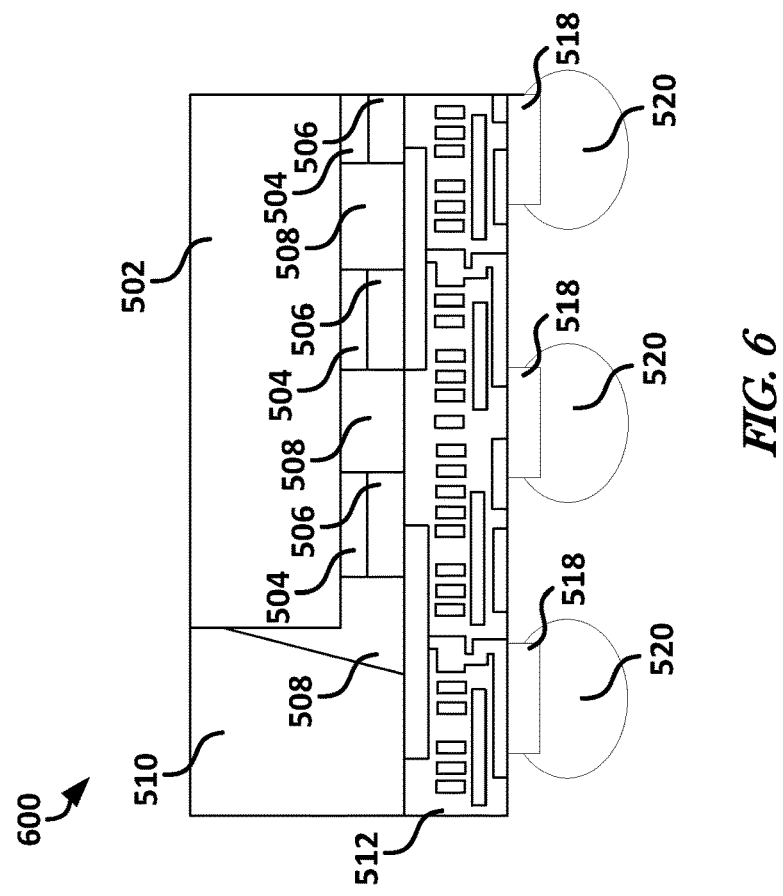
FIG. 6 illustrates, by way of example, a cross-section diagram of an embodiment of a device including a silicon interposer without a TSV.

FIG. 6 illustrates, by way of example, a cross-section diagram of an embodiment of a device 600 that includes a silicon interposer 512 and no TSVs. The device 600 is similar to the device 500, with the device 600 not including the silicon substrate 514 or the TSVs 516. The TSVs 516 and silicon substrate 514 can be avoided by using a selective silicon removal process to expose portions of the silicon interposer 512 and provide sufficient backside contact formation between the pads and the silicon interposer. A mechanical support material can be deposited over the die and the molding, such as to help provide warpage control during manufacturing.

The high density interconnect structures discussed herein can be used to replace the silicon interposer 512. The same benefits of replacing a high density interconnect structure that is built using high and medium k dielectric materials (no low k dielectric materials) can be realized by replacing the silicon interposer 512 with the high density interconnect structure discussed herein.

Figure 7:
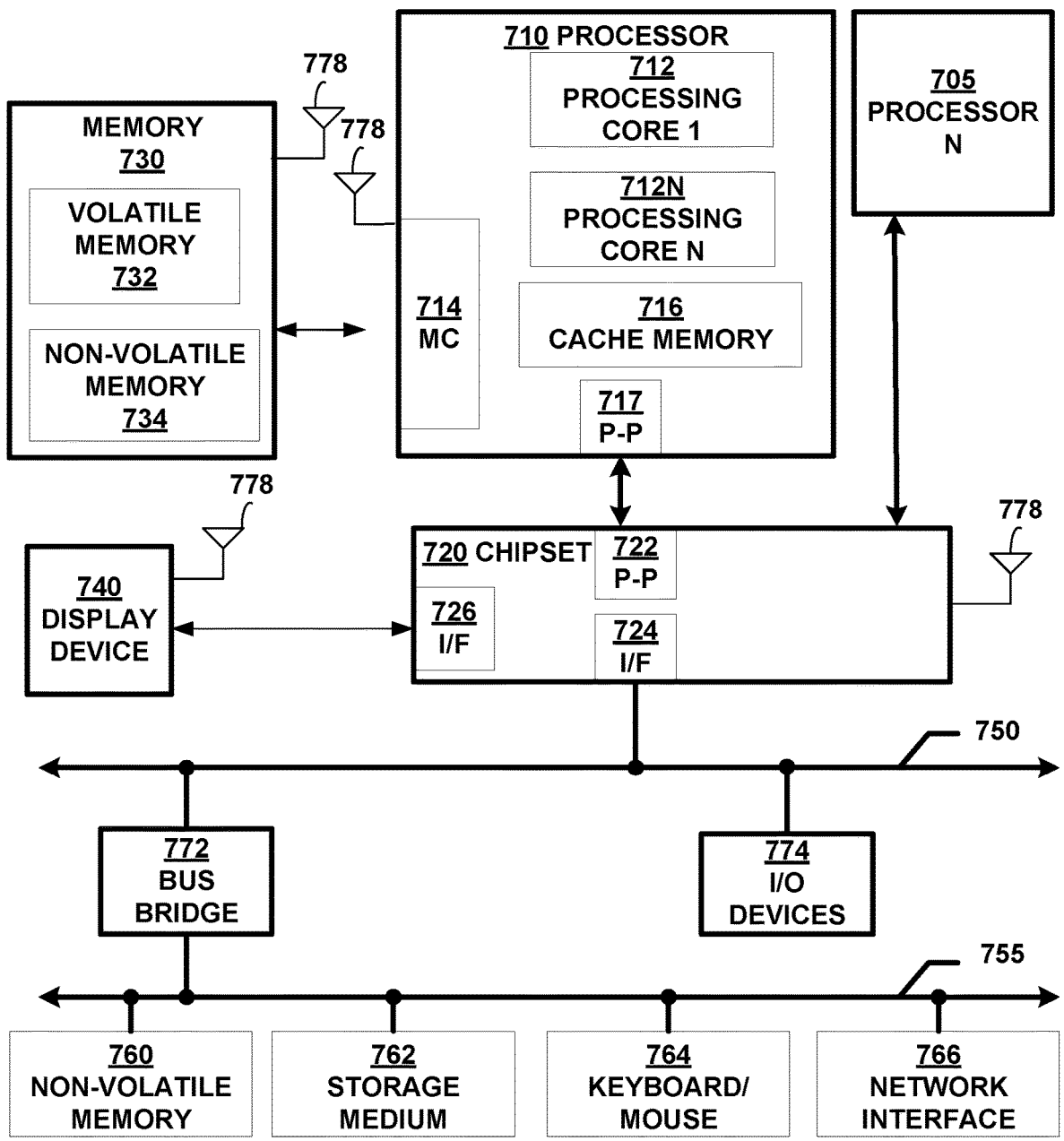
FIG. 7 illustrates, by way of example, a block diagram of an electronic device which can include a high density interconnect structure as disclosed herein.

FIG. 7 illustrates, by way of example, a logical block diagram of an embodiment of system 700. In one or more embodiments, system 700 includes one or more components that can include or be connected to the high density interconnect structure 200 or 300 in one or more embodiments.

In one embodiment, processor 710 has one or more processing cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the invention, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, a mass storage device(s) 762, a keyboard/mouse 764, and a network interface 766 via interface 724 and/or 704, etc.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the components shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

ADDITIONAL NOTES AND EXAMPLES

In Example 1 a high density interconnect structure can include a stack of alternating dielectric layers and metallization layers comprising at least three metallization layers including conductive material with low k dielectric material between the conductive material, and at least two dielectric layers including first medium k dielectric material with one or more first vias extending therethrough, the at least two dielectric layers situated between two metallization layers of the at least three metallization layers, a second medium k dielectric material directly on a top surface of the stack, a second via extending through the second medium k dielectric material, the second via electrically connected to conductive material in a metallization layer of the three or more metallization layers, and a pad over the second medium k dielectric material and electrically connected to the second via.

In Example 2 the structure of Example 1 can include a high k dielectric material between the pad and the second medium k dielectric material.

In Example 3 the structure of Example 2 can include, wherein a thickness of the high k dielectric material is less than one micrometer.

In Example 4, the structure of at least one of Examples 1-3 can include a third medium k dielectric material directly on a bottom surface of the stack, the bottom surface of the stack opposite the top surface of the stack.

In Example 5, the structure of Example 4 can include, wherein a thickness of the third medium k dielectric material is about five micrometers.

In Example 6, the structure of at least one of Examples 1-5 can include, wherein the at least three metallization layers include only three metallization layers and the at least two dielectric layers includes only two dielectric layers.

In Example 7, the structure of Example 6 can include, wherein the three metallization layers include two signal routing layers and one reference plane layer with one of the two signal routing layers on each side of the reference plane layer.

In Example 8, the structure of at least one of Examples 1-7 can include, wherein the at least three metallization layers include only four metallization layers and the at least two dielectric layers includes only three dielectric layers.

In Example 9, the structure of Example 8 can include, wherein four metallization layers include two reference plane layers and two signal routing layers, wherein one of the two signal routing layers is situated between the two reference plane layers.

In Example 10, the structure of at least one of Examples 1-9 can include, wherein a thickness of the at least three metallization layers is about two micrometers and a thickness of the at least two dielectric layers is about three micrometers.

In Example 11, the structure of at least one of Examples 1-10 can include, wherein the at least three metallization layers include at least one reference plane layer and at least two routing signal layers, wherein a thickness of the at least two dielectric layers is about three micrometers, wherein a thickness of the at least one reference plane layer is between about three micrometers and about four micrometers, and wherein a thickness of the at least two routing signal layers is about two micrometers.

In Example 12 a method of making a high density interconnect structure comprising forming a stack of alternating dielectric layers and metallization layers comprising: depositing a first low k dielectric material on a first medium k dielectric material, patterning the first low k dielectric material to expose portions of the first medium k dielectric material, forming first conductive material on the exposed portions of the first medium k dielectric material, depositing a second medium k dielectric material on the first conductive material and the first low k dielectric material, forming one or more vias in the second medium k dielectric material, depositing a second low k dielectric material on the second medium k dielectric material and the one or more vias, patterning the second low k dielectric material to expose portions of the second medium k dielectric material, and forming second conductive material on the exposed portions of the second medium k dielectric material, and forming a pad over the second low k dielectric material to electrically couple the pad to the second conductive material.

In Example 13, the structure of Example 12 can include depositing the first medium k dielectric material prior to depositing the first low k dielectric material.

In Example 14, the structure of Example 13 can include, wherein depositing the first medium k dielectric material includes depositing the first medium k dielectric material to a thickness of about five micrometers, depositing the first low k dielectric material includes depositing the first low k dielectric material to a thickness of about two micrometers, and depositing the second medium k dielectric material includes depositing the second medium k dielectric material to a thickness of about three micrometers.

In Example 15, the structure of Example 13 can include, wherein depositing the first medium k dielectric material includes depositing the first medium k dielectric material to a thickness of about five micrometers, depositing the first low k dielectric material includes depositing the first low k dielectric material to a thickness of between about three micrometers and about four micrometers, and depositing the second medium k dielectric material includes depositing the second medium k dielectric material to a thickness of about three micrometers.

In Example 16 a high density interconnect structure includes a stack of alternating dielectric layers and metallization layers comprising at least three metallization layers including conductive material with low k dielectric material between the conductive material, and at least two dielectric layers including first silicon dioxide with one or more first vias extending therethrough, the at least two dielectric layers situated between two metallization layers of the at least three metallization layers, and a second silicon dioxide directly on a top surface of the stack, a high k dielectric material directly on the second silicon dioxide, a second via extending through the second silicon dioxide, the second via electrically connected to conductive material in a metallization layer of the three or more metallization layers, and a pad over the second silicon dioxide and electrically connected to the second via.

In Example 17, the structure of Example 16 can include a third silicon dioxide directly on a bottom surface of the stack, the bottom surface of the stack opposite the top surface of the stack.

In Example 18, the structure of Example 17 can include, wherein a thickness of the high k dielectric material is less than one micrometer and wherein a thickness of the third medium k dielectric material is about five micrometers.

In Example 19, the structure of Example 18 can include, wherein a thickness of the at least three metallization layers is about two micrometers and a thickness of the at least two dielectric layers is about three micrometers.

In Example 20, the structure of Example 18 can include, wherein the at least three metallization layers include at least one reference plane layer and at least two routing signal layers, wherein a thickness of the at least two dielectric layers is about three micrometers, wherein a thickness of the at least one reference plane layer is between about three micrometers and about four micrometers, and wherein a thickness of the at least two routing signal layers is about two micrometers.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A high density interconnect structure comprising:
a stack of alternating dielectric layers and metallization layers comprising:
at least three metallization layers including conductive material with low k dielectric material between the conductive material; and
at least two dielectric layers including first medium k dielectric material with one or more first vias extending therethrough, the at least two dielectric layers situated between two metallization layers of the at least three metallization layers;
a second medium k dielectric material directly on a top surface of the stack;
a second via extending through the second medium k dielectric material, the second via electrically connected to conductive material in a metallization layer of the three or more metallization layers;
a high k dielectric material directly on the second medium k dielectric material; and
a pad directly on the high k dielectric material and electrically connected to the second via.

2. The structure of claim 1, wherein a thickness of the high k dielectric material is less than one micrometer.

3. The structure of claim 1, further comprising:
a third medium k dielectric material directly on a bottom surface of the stack, the bottom surface of the stack opposite the top surface of the stack.

4. The structure of claim 3, wherein a thickness of the third medium k dielectric material is about five micrometers.

5. The structure of claim 1, wherein the at least three metallization layers include only three metallization layers and the at least two dielectric layers includes only two dielectric layers.

6. The structure of claim 5, wherein the three metallization layers include two signal routing layers and one reference plane layer with one of the two signal routing layers on each side of the reference plane layer.

7. The structure of claim 1, wherein the at least three metallization layers include only four metallization layers and the at least two dielectric layers includes only three dielectric layers.

8. The structure of claim 7, wherein four metallization layers include two reference plane layers and two signal routing layers, wherein one of the two signal routing layers is situated between the two reference plane layers.

9. The structure of claim 1, wherein a thickness of the at least three metallization layers is about two micrometers and a thickness of the at least two dielectric layers is about three micrometers.

10. The structure of claim 1, wherein the at least three metallization layers include at least one reference plane layer and at least two routing signal layers, wherein a thickness of the at least two dielectric layers is about three micrometers, wherein a thickness of the at least one reference plane layer is between about three micrometers and about four micrometers, and wherein a thickness of the at least two routing signal layers is about two micrometers.

11. A high density interconnect structure comprising:
a stack of alternating dielectric layers and metallization layers comprising:
at least three metallization layers including conductive material with low k dielectric material between the conductive material; and
at least two dielectric layers including first silicon dioxide with one or more first vias extending therethrough, the at least two dielectric layers situated between two metallization layers of the at least three metallization layers; and
a second silicon dioxide directly on a top surface of the stack;
a high k dielectric material directly on the second silicon dioxide;
a second via extending through the second silicon dioxide, the second via electrically connected to conductive material in a metallization layer of the three or more metallization layers; and
a pad over the second silicon dioxide and electrically connected to the second via.

12. The structure of claim 11, further comprising:
a third silicon dioxide directly on a bottom surface of the stack, the bottom surface of the stack opposite the top surface of the stack.

13. The structure of claim 12, wherein a thickness of the high k dielectric material is less than one micrometer and wherein a thickness of the third medium k dielectric material is about five micrometers.

14. The structure of claim 13, wherein a thickness of the at least three metallization layers is about two micrometers and a thickness of the at least two dielectric layers is about three micrometers.

15. The structure of claim 13, wherein the at least three metallization layers include at least one reference plane layer and at least two routing signal layers, wherein a thickness of the at least two dielectric layers is about three micrometers, wherein a thickness of the at least one reference plane layer is between about three micrometers and about four micrometers, and wherein a thickness of the at least two routing signal layers is about two micrometers.

* * * * *